US009796810B2

(12) United States Patent
Chujo et al.

(10) Patent No.: US 9,796,810 B2
(45) Date of Patent: Oct. 24, 2017

(54) HEAT-CURABLE COMPOSITION, DRY FILM, AND PRINTED WIRING BOARD

(71) Applicant: TAIYO INK MFG. CO., LTD., Hiki-gun (JP)

(72) Inventors: Takayuki Chujo, Hiki-gun (JP); Arata Endo, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 14/901,440

(22) PCT Filed: Jun. 27, 2014

(86) PCT No.: PCT/JP2014/067210
§ 371 (c)(1),
(2) Date: Dec. 28, 2015

(87) PCT Pub. No.: WO2014/208737
PCT Pub. Date: Dec. 31, 2014

(65) Prior Publication Data
US 2016/0369044 A1    Dec. 22, 2016

(30) Foreign Application Priority Data
Jun. 28, 2013    (JP) ................................. 2013-137185

(51) Int. Cl.
| B32B 3/00 | (2006.01) |
| C08G 59/68 | (2006.01) |
| H05K 3/46 | (2006.01) |
| H05K 1/02 | (2006.01) |
| H05K 1/03 | (2006.01) |
| H05K 1/11 | (2006.01) |
| H05K 3/00 | (2006.01) |
| H05K 3/22 | (2006.01) |
| H05K 3/40 | (2006.01) |

(52) U.S. Cl.
CPC .......... *C08G 59/68* (2013.01); *C08G 59/686* (2013.01); *C08G 59/688* (2013.01); *H05K 1/0271* (2013.01); *H05K 1/0298* (2013.01); *H05K 1/0373* (2013.01); *H05K 1/115* (2013.01); *H05K 3/0011* (2013.01); *H05K 3/22* (2013.01); *H05K 3/4038* (2013.01); *H05K 3/4611* (2013.01); *H05K 3/4676* (2013.01); *H05K 2203/0537* (2013.01)

(58) Field of Classification Search
CPC .... C08G 59/68; C08G 59/686; C08G 59/688; H01K 1/0271; H01K 1/0298; H01K 1/0373; H01K 1/115
See application file for complete search history.

(56) References Cited

U.S. PATENT DOCUMENTS

| 2003/0047809 | A1  | 3/2003 | Takeuchi et al. |
| 2004/0063870 | A1* | 4/2004 | Burns ................... C08G 59/186 525/523 |
| 2006/0083928 | A1  | 4/2006 | Miyagawa et al. |
| 2007/0148442 | A1* | 6/2007 | Shibayama ............. C08L 63/00 428/336 |
| 2008/0166550 | A1* | 7/2008 | Inoue ....................... G03C 5/00 428/336 |
| 2009/0314532 | A1  | 12/2009 | Hayashi et al. |
| 2011/0083890 | A1  | 4/2011 | Tanaka et al. |
| 2015/0016072 | A1  | 1/2015 | Iwayama et al. |

FOREIGN PATENT DOCUMENTS

| CN | 102040803 A | 5/2011 |
| JP | 7-224148 | 8/1995 |
| JP | 2003-147049 | 5/2003 |
| JP | 2006-117848 | 5/2006 |
| JP | 2006-137943 | 6/2006 |
| JP | 2007-23097 | 2/2007 |
| JP | 2008-222933 | 9/2008 |
| JP | 2009-114325 | 5/2009 |
| JP | 2009-227992 | 10/2009 |
| JP | 2010-001403 | 1/2010 |
| JP | 2010-153506 | 7/2010 |
| JP | 2011-202140 | 10/2011 |
| JP | 2012-25800 | 2/2012 |
| JP | 2012-094691 | 5/2012 |
| JP | 2013-116931 A | 6/2013 |
| WO | 2013/094606 A1 | 6/2013 |

OTHER PUBLICATIONS

International Search Report dated Sep. 22, 2014 in PCT/JP14/67210 Filed Jun. 27, 2014.
Combined Chinese Office Action and Search Report dated Jul. 6, 2016 in Patent Application No. 201480024160.8 (with English translation).

* cited by examiner

*Primary Examiner* — Elizabeth Mulvaney
(74) *Attorney, Agent, or Firm* — Oblon, McClelland, Maier & Neustadt, L.L.P.

(57) ABSTRACT

An object of the present invention is to provide: a heat-curable composition capable of yielding a cured article in which crack generation during a heating-cooling cycle can be inhibited; a dry film thereof; and a printed wiring board comprising the cured article. The heat-curable composition is characterized by comprising a semisolid or a solid epoxy compound and a curing accelerator that is made miscible with the epoxy compound when heated at 130 to 220° C. The dry film comprises a resin layer formed from this heat-curable composition, and the printed wiring board comprises a cured article obtained from the heat-curable composition or the dry film.

20 Claims, 2 Drawing Sheets

US 9,796,810 B2

HEAT-CURABLE COMPOSITION, DRY FILM, AND PRINTED WIRING BOARD

TECHNICAL FIELD

The present invention relates to a heat-curable composition, a dry film and a printed wiring board. More particularly, the present invention relates to: a heat-curable composition capable of yielding a cured article in which crack generation during a heating-cooling cycle can be inhibited; a dry film thereof; and a printed wiring board comprising the cured article.

BACKGROUND ART

In recent years, as a method of producing a multilayer printed wiring board, a production technique using a build-up method in which resin insulating layers and conductor layers are alternately stacked on a conductor layer of an inner-layer circuit board has been drawing attention. For example, there has been proposed a method of producing a multilayer printed wiring board in which, after coating and heat-curing an epoxy resin composition on an inner-layer circuit board having a circuit formed thereon, the resulting surface is treated with a roughening agent to form an irregularly roughened surface and a conductor layer is subsequently formed by plating. Further, there has also been proposed a method of producing a multilayer printed wiring board in which an adhesive sheet of an epoxy resin composition is laminated and heat-cured on an inner-layer circuit board having a circuit formed thereon and a conductor layer is subsequently formed (see Patent Document 1).

RELATED ART DOCUMENT

Patent Document

Patent Document 1: Japanese Unexamined Patent Application Publication No. 2010-1403 (Claims)

SUMMARY OF THE INVENTION

Problems to be Solved by the Invention

It is difficult to form a cured coating film having a high glass transition temperature (Tg) using a conventional epoxy resin composition for interlayer insulating layer, and the resulting cured coating film does not show sufficient cracking resistance during a heating-cooling cycle. Thus, in order to inhibit crack generation during a heating-cooling cycle, the filler content was increased so that the coefficient of linear thermal expansion (CTE) of the cured coating film was adjusted with that of the substrate used as a base as much as possible; however, sufficient cracking resistance could not be attained.

Focusing on the liquid epoxy resins incorporated in conventional epoxy resin compositions, the present inventors examined to form a cured coating film having excellent cracking resistance by adopting a composition in which a semisolid or solid epoxy resin is incorporated in place of a liquid epoxy resin and thereby increasing the glass transition temperature (Tg) and reducing the coefficient of linear thermal expansion (CTE). However, even in such a cured coating film having a high glass transition temperature (Tg) and a low coefficient of linear thermal expansion (CTE), sufficient cracking resistance was not attained.

Therefore, an object of the present invention is to provide: a heat-curable composition capable of yielding a cured article in which crack generation during a heating-cooling cycle can be inhibited; a dry film thereof; and a printed wiring board comprising the cured article.

Means for Solving the Problems

In view of the above, the present inventors intensively studied to discover that the above-described problems can be solved by incorporating a curing accelerator miscible with an epoxy resin in a temperature range of heat-curing process, thereby completing the present invention.

That is, the heat-curable composition of the present invention is characterized by comprising: a semisolid or solid epoxy compound; and a curing accelerator that is made miscible with the epoxy compound when heated at 130 to 220° C.

It is preferred that the heat-curable composition of the present invention further comprise a solvent.

In the heat-curable composition of the present invention, it is preferred that the curing accelerator be at least one of imidazole compounds and phosphonium salts.

It is preferred that the heat-curable composition of the present invention be used for producing of a printed wiring board.

The dry film of the present invention is characterized by comprising a resin layer formed from the above-described heat-curable composition.

The printed wiring board of the present invention is characterized by comprising a cured article obtained by curing the above-described heat-curable composition or the resin layer of the above-described dry film.

Effects of the Invention

According to the present invention, a heat-curable composition capable of yielding a cured article in which crack generation during a heating-cooling cycle can be inhibited, a dry film thereof, and a printed wiring board comprising the cured article can be provided.

MODE FOR CARRYING OUT THE INVENTION

The heat-curable composition of the present invention comprises: a semisolid or solid epoxy compound; and a curing accelerator that is made miscible with the epoxy compound when heated at 130 to 220° C. By reducing the amount of liquid epoxy resin and incorporating such a curing accelerator, not only the glass transition temperature (Tg) is increased and the coefficient of linear thermal expansion (CTE) is reduced, but also a cured article in which crack generation during a heating-cooling cycle can be inhibited is obtained. When a curing accelerator is not sufficiently miscible with an epoxy resin in a temperature range of heat-curing process, coarse particles are generated in the resulting cured coating film; however, it is believed that the generation of coarse particles is inhibited by using such a curing accelerator as described above and crack generation during a heating-cooling cycle is consequently inhibited. Moreover, by incorporating a specific curing accelerator, a cured article further having excellent BHAST resistance can be obtained.

The components of the heat-curable composition of the present invention will now each be described.

[Semisolid Epoxy Compound and Solid Epoxy Compound]

The heat-curable composition of the present invention contains at least one of semisolid epoxy compounds and solid epoxy compounds. In the present specification, the term "semisolid epoxy resin" refers to an epoxy resin that is solid at 20° C. but liquid at 40° C., and the term "solid epoxy resin" refers to an epoxy resin that is solid at 40° C. Further, the term "liquid epoxy resin" refers to an epoxy resin that is liquid at 20° C.

The assessment of liquid state is performed in accordance with Appendix 2 "Verification Method of Liquid State" of The Ministerial Ordinance on Testing and Nature of Hazardous Materials (Ministry of Home Affairs, Ordinance No. 1, 1989).

(1) Apparatus

Thermostat Water Bath:

A thermostat water bath which is equipped with a stirrer, a heater, a thermometer and an automatic temperature regulator (one capable of controlling the temperature in a range of ±0.1° C.) and has a depth of not less than 150 mm is used.

For the assessment of the epoxy resins used in the below-described Examples, a low-temperature thermostat water bath (model BU300) and an immersion-type thermostat apparatus THERMOMATE (model BF500), both of which are manufactured by Yamato Scientific Co., Ltd., were used in combination and, after loading about 22 L of tap water to the low-temperature thermostat water bath (model BU300), THERMOMATE (model BF500) integrated therewith was turned on and its temperature was set (at 20° C. or 40° C.), and the water temperature was then finely adjusted to ±0.1° C. of the preset temperature using THERMOMATE (model BF500); however, any apparatus capable of performing such adjustment can be used.

Figure 1:
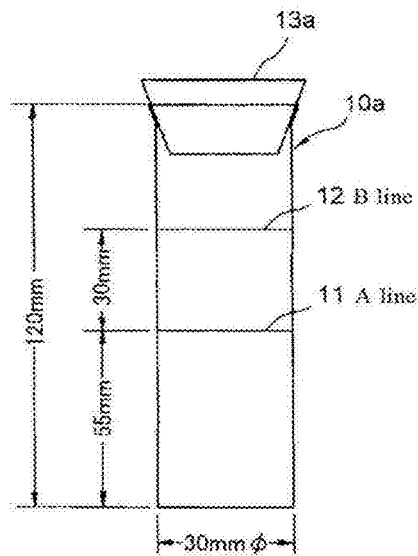
FIG. 1 provides side views schematically showing the two test tubes used for assessing the liquid state of epoxy resins.
Figure 1:
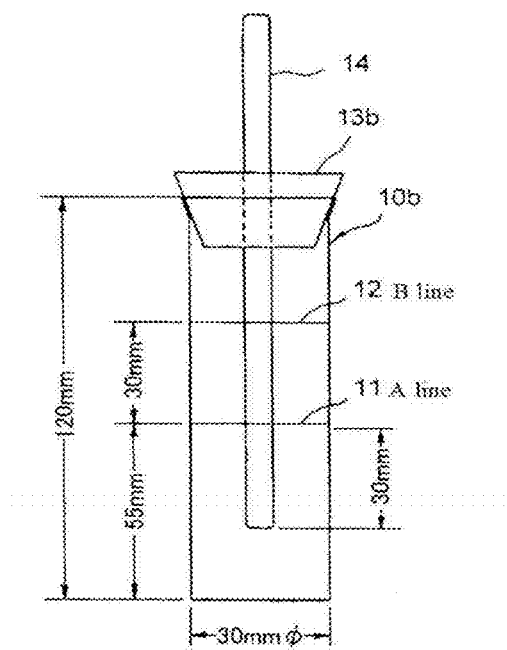

Test Tube:

As test tubes, as shown in FIG. 1, a test tube for liquid assessment 10a, which is a flat-bottomed cylindrical transparent glass test tube having an inner diameter of 30 mm and a height of 120 mm on which marked lines 11 and 12 are provided at heights of 55 mm and 85 mm from the tube bottom, respectively and whose mouth is sealed with a rubber stopper 13a, and a test tube for temperature measurement 10b having the same size on which marked lines are provided in the same manner and whose mouth is sealed with a rubber stopper 13b having a hole in the center for insertion and support of a thermometer, through which rubber stopper 13b a thermometer 14 is inserted, are used. Hereinafter, the marked line provided at a height of 55 mm from the tube bottom is referred to as "A line" and the marked line provided at a height of 85 mm from the tube bottom is referred to as "B line".

As the thermometer 14, a thermometer for measurement of solidification point that is prescribed in JIS B7410 (1982) "Liquid-in-glass thermometers for testing of petroleum product" (SOP-58, scale range: 20 to 50° C.) is used; however, any thermometer capable of measuring a temperature range of 0 to 50° C. can be used.

(2) Test Procedure

A sample left to stand at a temperature of 20±5° C. under atmospheric pressure for not less than 24 hours is placed in the test tube for liquid assessment 10a shown in FIG. 1(a) and the test tube for temperature measurement 10b shown in FIG. 1(b), each up to the A line. The two test tubes 10a and 10b are then placed vertically in the low-temperature thermostat water bath such that the B line comes below the water level. The thermometer is set such that its lower end is arranged 30 mm below the A line.

Once the sample temperature reached the preset temperature ±0.1° C., this condition is maintained for 10 minutes. After the 10 minutes, the test tube for liquid assessment 10a is taken out of the low-temperature thermostat water bath and immediately placed horizontally on a horizontal test bench, and the time required for the front edge of the liquid surface in the test tube to move from the A line to the B line is measured using a stopwatch and recorded. The sample is determined to be a liquid when the measured time is within 90 seconds at the preset temperature, or a solid when the measured time exceeds 90 seconds.

The semisolid epoxy compound or solid epoxy compound is not particularly restricted as long as it is each an epoxy group-containing semisolid or solid compound that is used as a heat-curable resin component, and any conventionally known epoxy compound can be used. Examples of the semisolid epoxy compound or solid epoxy compound include semisolid or solid bifunctional epoxy compounds having two epoxy groups in the molecule; and semisolid or solid polyfunctional epoxy compounds having three or more epoxy groups in the molecule. A hydrogenated semisolid or solid bifunctional epoxy compound can also be used.

Examples of the semisolid epoxy compound include bisphenol A-type epoxy resins, such as EPICLON 860, EPICLON 900-IM, EPICLON EXA-4816 and EPICLON EXA-4822 which are manufactured by DIC Corporation, ARALDITE AER280 manufactured by Asahi-Ciba Ltd., EPOTOHTO YD-134 manufactured by Tohto Kasei Co., Ltd., jER834 and jER872 manufactured by Japan Epoxy Resins Co., Ltd., and ELA-134 manufactured by Sumitomo Chemical Co., Ltd.; naphthalene-type epoxy resins such as EPICLON HP-4032 manufactured by DIC Corporation; and phenol novolac-type epoxy resins such as EPICLON N-740 manufactured by DIC Corporation.

Examples of the solid epoxy compound include naphthalene-type epoxy resins, such as HP-4700 (naphthalene-type epoxy resin) manufactured by DIC Corporation, EXA4700 (tetrafunctional naphthalene-type epoxy resin) manufactured by DIC Corporation and NC-7000 (naphthalene skeleton-containing polyfunctional solid epoxy resin) manufactured by Nippon Kayaku Co., Ltd; epoxidized condensates of a phenols and a phenolic hydroxyl group-containing aromatic aldehyde (trisphenol-type epoxy resins), such as EPPN-502H (trisphenol epoxy resin) manufactured by Nippon Kayaku Co., Ltd.; dicyclopentadiene aralkyl-type epoxy resins such as EPICLON HP-7200H (dicyclopentadiene skeleton-containing polyfunctional solid epoxy resin) manufactured by DIC Corporation; biphenylaralkyl-type epoxy resins such as NC-3000H (biphenyl skeleton-containing polyfunctional solid epoxy resin) manufactured by Nippon Kayaku Co., Ltd.; biphenyl/phenol novolac-type epoxy resins such as NC-3000L manufactured by Nippon Kayaku Co., Ltd.; novolac-type epoxy resins, such as EPICLON N660 and EPICLON N690 manufactured by DIC Corporation, and EOCN-104S manufactured by Nippon Kayaku Co., Ltd.; biphenyl-type epoxy resins such as YX-4000 manufactured by Mitsubishi Chemical Corporation; phosphoruscontaining epoxy resins such as TX0712 manufactured by Nippon Steel & Sumikin Chemical Co., Ltd.; and tris(2,3-epoxypropyl)isocyanurate such as TEPIC manufactured by Nissan Chemical Industries, Ltd.

The heat-curable composition of the present invention may contain both a semisolid epoxy compound and a solid epoxy compound. Further, the semisolid epoxy compounds and solid epoxy compounds may be used individually, or two or more thereof may be used in combination. Among the semisolid epoxy compounds and solid epoxy compounds, from the standpoints of, for example, obtaining a cured article having preferred physical properties, aromatic epoxy resins are preferred, and naphthalene-type epoxy resins and biphenyl-type epoxy resins are more preferred. In the present specification, the term "aromatic epoxy resin" means an epoxy resin having an aromatic ring skeleton in its molecule.

The total amount of the semisolid epoxy compound(s) and solid epoxy compound(s) is, in terms of solid content, preferably 10 to 50% by weight, more preferably 10 to 40% by weight, still more preferably 10 to 35% by weight, based on the total amount of the heat-curable composition of the present invention.

[Curing Accelerator]

The heat-curable composition of the present invention contains a curing accelerator that is made miscible with the semisolid or solid epoxy compound when heated at 130 to 220° C. The curing accelerator promotes heat-curing reaction and is used for further improving the properties such as adhesion, chemical resistance and heat resistance. In the present invention, by incorporating such a curing accelerator as described above, it is enabled to obtain a cured article in which crack generation during a heating-cooling cycle can be inhibited. In addition, by preparing a dry film using the heat-curable composition of the present invention, a highly flexible dry film which shows only minor cracking and detachment from a carrier film when bent can be obtained.

In the present invention, the expression "made miscible with" an epoxy compound "when heated at 130 to 220° C." refers to a case where a cured article obtained by mixing an epoxy compound to be incorporated with the curing accelerator and heating the resulting mixture at any temperature of 130 to 220° C. contains absolutely no coarse particle of 20 μm or larger. For example, a 1 mm-thick cured coating film made of a mixture of an epoxy resin and the curing accelerator is prepared by heat-curing the mixture at any temperature of 130 to 220° C. and, after cooling the thus obtained cured coating film to room temperature, the presence or absence of a coarse particle of 20 μm or larger can be examined and judged by observing an area of 1 cm×1 cm under an electron microscope at a magnification of ×25.

When the heat-curable composition of the present invention contains both a semisolid epoxy compound and a solid epoxy compound, a mixture of the semisolid epoxy compound and the solid epoxy compound is mixed with the curing accelerator, and the judgment can be performed in the above-described manner. Also when the heat-curable composition of the present invention further contains the below-described curing agent, the semisolid or solid epoxy compound to be incorporated is mixed with the curing accelerator and the judgment can be performed in the above-described manner. In the present specification, the temperature of heat-curing is 130 to 220° C., preferably 150 to 200° C.

The curing accelerator is not particularly restricted as long as it is made miscible with the semisolid or solid epoxy compound to be incorporated in the heat-curable composition of the present invention when heated at 130 to 220° C., and a conventionally known curing accelerator can be used. Specific examples of the curing accelerator include: imidazole and derivatives thereof, guanamines such as acetoguanamine and benzoguanamine; polyamines such as diaminodiphenyl methane, m-phenylenediamine, m-xylenediamine, diaminodiphenylsulfone, dicyanediamide, urea, urea derivatives, melamine and polybasic hydrazides; organic acid salts and/or epoxy adducts thereof; amine complexes of boron trifluoride; triazine derivatives such as ethyldiamino-S-triazine, 2,4-diamino-S-triazine and 2,4-diamino-6-xylyl-S-triazine; amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine and m-aminophenol; polyphenols such as polyvinylphenol, polyvinylphenol bromide, phenol novolac and alkylphenol novolac; organic phosphines such as tributylphosphine, triphenylphosphine and tris-2-cyanoethylphosphine; phosphonium salts such as tri-n-butyl(2,5-dihydroxyphenyl)phosphonium bromide and hexadecyltributyl phosphonium chloride; quaternary ammonium salts such as benzyltrimethyl ammonium chloride and phenyltributyl ammonium chloride; the above-described polybasic acid anhydrides; photocation polymerization catalysts such as diphenyliodonium tetrafluoroborate, triphenylsulfonium hexafluoroantimonate and 2,4,6-triphenylthiopyrylium hexafluorophosphate; styrene-maleic anhydride resins; and conventionally known curing accelerators, such as equimolar reaction products of phenylisocyanate and dimethylamine, equimolar reaction products of an organic polyisocyanate (e.g. tolylenediisocyanate, isophorone diisocyanate) and dimethylamine, and metal acetylacetonate compounds. Among these curing accelerators, imidazoles, imidazole derivatives and phosphonium salts are preferred.

The above-described curing accelerators may be used individually, or two or more thereof may be used in combination. The amount of the curing accelerator(s) to be incorporated is preferably 0.01 to 5 parts by weight, more preferably 0.1 to 5 parts by weight, with respect to 100 parts by weight of the total amount of the semisolid epoxy compound(s) and solid epoxy compound(s). When the amount is 0.01 parts by weight or greater, the curing time can be shortened. Meanwhile, when the amount is 5 parts by weight or less, the curing accelerator(s) can be made further miscible with the semisolid epoxy compound(s) and solid epoxy compound(s). When the curing accelerator is a metal compound, the amount thereof is, in terms of metal content, preferably 10 to 550 ppm, more preferably 25 to 200 ppm, with respect to 100 parts by weight of the heat-curable resin component.

(Solvent)

In the heat-curable composition of the present invention, a solvent can be used for, for example, preparation of a composition, adjustment of the viscosity for application on a substrate or a carrier film, and formation of a resin layer of a dry film. The solvent is not particularly restricted, and a conventionally known solvent can be used. The amount of the solvent to be incorporated is also not restricted.

When forming a dry film, it is preferred to incorporate two solvents, one of which has a boiling point of 100° C. or higher and the other of which has a boiling point of 5° C. or higher. The difference between the boiling points is preferably not less than 10° C., more preferably not less than 20° C. These solvents are not particularly restricted, and conventionally known solvents having a boiling point of 100° C. or higher can be used. In the present specification, when a solvent has a range in its boiling point, a range of the initial boiling point to the end point of distillation is defined as the boiling point of the solvent.

Examples of a solvent having a boiling point of lower than 100° C. include diethyl ether, carbon disulfide, acetone, chloroform, methanol, n-hexane, ethyl acetate, 1,1,1-trichloroethane, carbon tetrachloride, methyl ethyl ketone, isopropyl alcohol, trichloroethylene and isopropyl acetate.

Examples of a solvent having a boiling point of 100° C. or higher include isobutyl alcohol, toluene, methyl isobutyl ketone, n-butanol, butyl acetate, 2-methoxypropanol, isobutyl acetate, tetrachloroethylene, ethylene glycol monomethyl ether, methyl butyl ketone, isopentyl alcohol, ethylene glycol monoethyl ether, N,N-dimethylformamide, ethylene glycol monoethyl ether acetate, turpentine oil, cyclohexanone and ethylene glycol monobutyl ether.

Other examples of a solvent having a boiling point of 100° C. or higher include xylene; petroleum naphtha; SWASOL 1000 (8 to 10 carbon atoms: high-boiling-point aromatic hydrocarbon) and SWASOL 1500 (high-boiling-point aromatic hydrocarbon), which are manufactured by Maruzen Petrochemical Co., Ltd.; SOLVESSO 100 (9 to 10 carbon atoms: high-boiling-point aromatic hydrocarbon) and SOLVESSO 150 (10 to 11 carbon atoms: high-boiling-point aromatic hydrocarbon), which are manufactured by Standard Sekiyu Osaka Hatsubaisho Co., Ltd.; SOLVENT #100 and SOLVENT #150, which are manufactured by Sankyo Chemical Co., Ltd.; SHELLSOL A100 and SHELLSOL A150, which are manufactured by Shell Chemicals Japan Ltd.; and IPSOL 100 (whose main component is an aromatic hydrocarbon having 9 carbon atoms) and IPSOL 150 (whose main component is an aromatic hydrocarbon having 10 carbon atoms), which are manufactured by Idemitsu Kosan Co., Ltd. It is preferred that the high-boiling-point aromatic hydrocarbons contain an aromatic component in an amount of not less than 99% by volume. Further, it is also preferred that the high-boiling-point aromatic hydrocarbons contain benzene, toluene and xylene, each in an amount of less than 0.01% by volume.

The resin layer of the above-described dry film may contain three or more solvents having a boiling point of 100° C. or higher and, in that case, any two of the solvents may have different boiling points. Among those solvents having a boiling point of 100° C. or higher, ones having a boiling point of 100 to 230° C. are preferred, and ones having a boiling point of 100 to 220° C. are more preferred. When the boiling point is 230° C. or lower, the solvent mostly remains in the resin layer of the dry film after heat-curing or annealing process. As the solvents, toluene, N,N-dimethylformamide, cyclohexanone and aromatic hydrocarbons having 8 or more carbon atoms are still more preferred.

In cases where a dry film is formed using the heat-curable composition of the present invention, the amount of the solvent(s) after drying, that is, the ratio of the residual solvent content, is preferably 0.1 to 4% by weight, more preferably 0.3 to 3% by weight, based on the total weight of the resin layer of the dry film containing the solvent(s). When the ratio is 0.1% by weight or higher, cracking and powdering can be inhibited, while when the ratio is 4% by weight or less, the detachability is improved and the amount of residual air bubbles is reduced, so that crack generation can be inhibited.

(Other Heat-Curable Resin Component)

The heat-curable composition of the present invention may also contain a heat-curable resin component other than the above-described epoxy compounds. Examples of the heat-curable resin component include polyfunctional oxetane compounds and compounds having two or more thioether groups in the molecule, namely episulfide resins.

The heat-curable composition of the present invention may also contain a liquid epoxy compound as other heat-curable resin component in such a range that does not adversely affect the effects of the present invention. Examples of the liquid epoxy compound include bisphenol A-type epoxy resins, bisphenol F-type epoxy resins, bisphenol AF-type epoxy resins, phenol novolac-type epoxy resins, tert-butyl-catechol-type epoxy resins, glycidylamine-type epoxy resins, aminophenol-type epoxy resins and alicyclic epoxy resins.

When a liquid epoxy resin is incorporated, the glass transition temperature (Tg) of the resulting cured article is lowered and the cracking resistance may be impaired; therefore, the amount of the liquid epoxy resin to be incorporated is preferably 0 to 45% by weight, more preferably 0 to 30% by weight, particularly preferably 0 to 5% by weight, based on the total weight of the heat-curable resin component. The above-described heat-curable resin components may be used individually, or two or more thereof may be used in combination.

(Filler)

The heat-curable composition of the present invention may contain a filler. By incorporating a filler, the thermal strength is adjusted with that of a conductor layer made of copper or the like arranged around an insulating layer, so that the thermal properties of the dry film can be improved. As the filler, any of conventionally known inorganic and organic fillers can be used and the filler is not restricted to a specific one; however, an inorganic filler that inhibits shrinkage on curing of the resulting coating film and contributes to improving the properties such as adhesiveness and hardness is preferred. Examples of the inorganic filler include extender pigments such as barium sulfate, barium titanate, amorphous silica, crystalline silica, molten silica, spherical silica, talc, clay, magnesium carbonate, calcium carbonate, aluminum oxide, aluminum hydroxide, silicon nitride and aluminum nitride; and metal powders of copper, tin, zinc, nickel, silver, palladium, aluminum, iron, cobalt, gold, platinum and the like. Among these inorganic fillers, silica and barium sulfate that are hardly deteriorated by a roughening solution are preferred, and spherical silica is particularly preferred because it has a low specific gravity and excellent low-thermal-expansion properties and can thus be incorporated into the composition at a high ratio. The average particle size of the filler is preferably 3 µm or smaller, more preferably 1 µm or smaller. The average particle size can be determined using a laser-diffraction particle size distribution analyzer.

The amount of the filler to be incorporated is preferably 1 to 90% by weight, more preferably 10 to 90% by weight, still more preferably 30 to 80% by weight, based on the total amount of the composition. When the amount of the filler is 1% by weight or greater, thermal expansion is inhibited and the heat resistance is improved, while when the amount of the filler is 90% by weight or less, crack generation can be inhibited.

(Curing Agent)

The heat-curable composition of the present invention may contain a curing agent. Examples of the curing agent include phenol resins, polycarboxylic acids and anhydrides thereof, cyanate ester resins, and active ester resins. These curing agents may be used individually, or two or more thereof may be used in combination. In the present specification, the term "curing agent" refers to a compound having superior curing effect than the curing accelerator, and the heat-curable composition of the present invention can be cured by only one of the curing agent and the curing accelerator.

As the above-described phenol resins, one or a combination of two or more of conventionally known phenol resins, such as phenol novolac resins, alkylphenol novolac resins, bisphenol A novolac resins, dicyclopentadiene-type phenol resins, Xylok-type phenol resins, terpene-modified phenol resins, cresol/naphthol resins, polyvinylphenols, phenol/naphthol resins, α-naphthol skeleton-containing phenol resins and triazine-containing cresol novolac resins, can be used.

The above-described polycarboxylic acids and anhydrides thereof are compounds having two or more carboxyl groups in one molecule and acid anhydrides thereof, examples of which include copolymers of (meth)acrylic acid, copolymers of maleic anhydride and condensates of dibasic acids as well as resins having carboxylic acid terminals, such as carboxylic acid-terminated imide resins.

The above-described cyanate ester resins are compounds having two or more cyanate ester groups (—OCN) in one molecule. As a cyanate ester resin, any of conventionally known cyanate ester resins can be used. Examples of the cyanate ester resins include phenol novolac-type cyanate ester resins, alkylphenol novolac-type cyanate ester resins, dicyclopentadiene-type cyanate ester resins, bisphenol A-type cyanate ester resins, bisphenol F-type cyanate ester resins and bisphenol S-type cyanate ester resins. These cyanate ester resins may also be prepolymers that are partially triazinized.

The above-described active ester resins are resins having two or more active ester groups in one molecule. Generally, an active ester resin can be obtained by a condensation reaction between a carboxylic acid compound and a hydroxy compound. Particularly, an active ester compound obtained using a phenol compound or a naphthol compound as the hydroxy compound is preferred. Examples of the phenol compound or naphthol compound include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzene triol, dicyclopentadienyl diphenol and phenol-novolac.

Further, as the curing agent, an alicyclic olefin polymer having either one of a carboxyl group and a carboxylic acid anhydride group can also be used. Specific examples of a method of producing an alicyclic olefin polymer include: (1) a method of polymerizing an alicyclic olefin having a carboxyl group and/or a carboxylic acid anhydride group (hereinafter, referred to as "carboxyl group and/or the like"), optionally with other monomer(s) as required; (2) a method of polymerizing an aromatic olefin having a carboxyl group and/or the like, optionally with other monomer(s) as required, to obtain a (co)polymer and then hydrogenating the aromatic ring moiety of the (co)polymer; (3) a method of copolymerizing an alicyclic olefin having no carboxyl group or the like with a monomer having a carboxyl group and/or the like; (4) a method of copolymerizing an aromatic olefin having no carboxyl group or the like with a monomer having a carboxyl group and/or the like to obtain a copolymer and then hydrogenating the aromatic ring moiety of the copolymer; (5) a method of introducing a compound having a carboxyl group and/or the like into an alicyclic olefin polymer having no carboxyl group or the like by a modification reaction; and (6) a method of preparing an alicyclic olefin polymer having a carboxylate group by any of the above-described methods (1) to (5) and then converting the carboxylate group into a carboxyl group by hydrolysis or the like. Particularly, a polymer obtained by the method (1) is preferred. As a polymerization method for obtaining an alicyclic olefin polymer, ring-opening polymerization or addition polymerization can be employed. When ring-opening polymerization is employed, it is preferred to hydrogenate the resulting ring-opened polymer.

Among those curing agents, phenol resins, cyanate ester resins, active ester resins, and alicyclic olefin polymers having a carboxyl group and/or the like are preferred.

It is preferred that the curing agent be incorporated such that the ratio between a functional group of the heat-curable resin component that is capable of undergoing heat-curing reaction, such as an epoxy group, and the functional group contained in the curing agent that reacts with the functional group of the heat-curable resin component (the functional group of the curing agent/the functional group of the heat-curable component (equivalence ratio)) is 0.2 to 2. By controlling the equivalence ratio in this range, roughening of the film surface in the desmear step can be inhibited. The equivalence ratio is more preferably 0.2 to 1.5, still more preferably 0.3 to 1.0.

(Thermoplastic Resin)

The heat-curable composition of the present invention may further contain a thermoplastic resin for improvement of the mechanical strength of the resulting cured coating film. Examples of the thermoplastic resin include thermoplastic polyhydroxy polyether resins; phenoxy resins which are condensates of epichlorohydrin and various bifunctional phenol compounds; phenoxy resins in which hydroxyl group of the hydroxyether moiety contained in the skeleton is esterified with various acid anhydrides or acid chlorides; polyvinylacetal resins; polyamide resins; polyamide imide resins; and block copolymers. These thermoplastic resins may be used individually, or two or more thereof may be used in combination. A phenoxy resin whose hydroxyl group is acylated is preferred because of its excellent electrical properties.

A polyvinylacetal resin is obtained by, for example, acetalization of a polyvinyl alcohol resin with an aldehyde. The aldehyde is not particularly restricted, and examples thereof include formaldehyde, acetaldehyde, propionaldehyde, butylaldehyde, amylaldehyde, hexyl aldehyde, heptyl aldehyde, 2-ethylhexylaldehyde, cyclohexylaldehyde, furfural, benzaldehyde, 2-methylbenzaldehyde, 3-methylbenzaldehyde, 4-methylbenzaldehyde, p-hydroxybenzaldehyde, m-hydroxybenzaldehyde, phenylacetaldehyde and β-phenylpropionaldehyde, among which butylaldehyde is preferred.

Specific examples of the phenoxy resins include FX280 and FX293, which are manufactured by Tohto Kasei Co., Ltd.; and YX8100, YL6954 and YL6974, which are manufactured by Mitsubishi Chemical Corporation.

Specific examples of the polyvinylacetal resins include S-LEC KS Series manufactured by Sekisui Chemical Co., Ltd., and specific examples of the polyamide resins include KS5000 Series manufactured by Hitachi Chemical Co., Ltd. and BP Series manufactured by Nippon Kayaku Co., Ltd. Further, specific examples of the polyamide imide resins include KS9000 Series manufactured by Hitachi Chemical Co., Ltd.

A thermoplastic polyhydroxy polyether resin containing a fluorene skeleton has a high glass transition temperature and excellent heat resistance; therefore, it maintains a low coefficient of thermal expansion attributed to the semisolid or solid epoxy resin as well as the glass transition temperature of the semisolid or solid epoxy resin, so that the resulting cured coating film has a good balance of low coefficient of thermal expansion and high glass transition temperature.

Further, since a thermoplastic polyhydroxy polyether resin has hydroxyl groups, it shows good adhesion with a substrate and a conductor, and the resulting cured coating film is hardly deteriorated by a roughening agent; however, since a roughening liquid in an aqueous solution form easily infiltrates into the interface between the cured coating film and a filler, a roughening treatment allows the filler on the cured coating film surface to easily fall off and this makes it easier to form a favorable roughened surface.

As the thermoplastic resin, a block copolymer may also be used. The term "block copolymer" refers to a copolymer having a molecular structure in which two or more polymers having different properties are linked via covalent bonds to form a long chain.

The block copolymer is preferably an A-B-A type or A-B-A' type block copolymer. Among A-B-A type and A-B-A' type block copolymers, ones that are constituted by a middle polymer unit B, which is a soft block having a low glass transition temperature (Tg) of preferably lower than 0° C., and outer polymer units A or A', which are hard blocks having a high glass transition temperature (Tg) of preferably 0° C. or higher, are preferred. The glass transition temperature (Tg) is measured by differential scanning calorimetry (DSC).

Further, among A-B-A type and A-B-A' type block copolymers, ones in which A or A' is a polymer unit having a glass transition temperature (Tg) of 50° C. or higher and B is a polymer unit having a glass transition temperature (Tg) of −20° C. or lower are more preferred.

Still further, among A-B-A type and A-B-A' type block copolymers, ones in which A or A' has a high miscibility with the above-described heat-curable components and B has a low miscibility with the above-described heat-curable components are preferred. It is believed that a block copolymer whose blocks of both ends are miscible with a matrix but the middle block is immiscible with the matrix in this manner is likely to exhibit a specific structure in the matrix.

Among those thermoplastic resins, phenoxy resins, polyvinylacetal resins, fluorene skeleton-containing thermoplastic polyhydroxy polyether resins and block copolymers are preferred.

It is preferred that the thermoplastic resin be incorporated in an amount of 1 to 20 parts by weight, preferably 1 to 10 parts by weight, with respect to 100 parts by weight of the heat-curable resin component. When the amount of the thermoplastic resin is in the above-described range, a uniformly roughened surface state can be easily obtained.

(Rubber Particle)

The resin layer of the dry film of the present invention may further contain rubber particles as required. Examples of the rubber particles include particles of polybutadiene rubber, polyisopropylene rubber, urethane-modified polybutadiene rubber, epoxy-modified polybutadiene rubber, acrylonitrile-modified polybutadiene rubber, carboxyl group-modified polybutadiene rubber, carboxyl group- or hydroxyl group-modified acrylonitrile-butadiene rubber; and cross-linked rubber particles and core shell-type rubber particles thereof. These rubber particles may be used individually, or two or more kinds thereof may be used in combination. Examples of the core shell-type rubber particles include particles having a core-shell structure in which a core layer composed of a rubber-like polymer is covered with a shell layer composed of a glass-like polymer; and particles having an intermediate layer composed of a rubber-like polymer between a core layer and a shell layer that are composed of a glass-like polymer. These rubber particles are added for the purposes of improving the flexibility of the resulting cured coating film and enabling a surface roughening treatment with an oxidizing agent so as to improve the strength of adhesion with a copper foil and the like.

The average particle size of the rubber particles is in a range of preferably 0.005 to 1 µm, more preferably 0.2 to 1 µm. In the present invention, the average particle size of the rubber particles can be measured by a dynamic light scattering method. For example, the rubber particles are uniformly dispersed in an appropriate organic solvent by ultrasonication or the like, the weight-based particle size distribution of the rubber particles is determined using FPRA-1000 (manufactured by Otsuka Electronics Co., Ltd.) and the median diameter thereof can be defined as the average particle size.

The amount of the rubber particles to be incorporated is preferably 0.5 to 10 parts by weight, more preferably 1 to 5 parts by weight, with respect to 100 parts by weight of the heat-curable resin component. When the amount of the rubber particles is 0.5 parts by weight or greater, the cracking resistance is improved and the strength of adhesion with a conductor pattern and the like can also be improved. Meanwhile, when the amount of the rubber particles is 10 parts by weight or less, the coefficient of thermal expansion (CTE) is reduced and the glass transition temperature (Tg) is increased, so that the curing properties are improved.

(Flame Retardant)

In the heat-curable composition of the present invention, in order to impart it with flame retardancy, a flame retardant can be incorporated. The flame retardant is not particularly restricted as long as it is a conventionally known flame retardant; however, from the standpoints of the miscibility with resins, heat resistance and the like, halogen-based flame retardants, phosphorus-based flame retardants, aluminum hydroxide, boehmite, magnesium hydroxide and antimony-based flame retardants are preferred.

These flame retardants may be used individually, or two or more thereof may be used in combination. The amount of the flame retardant(s) to be incorporated is preferably 3 to 30 parts by weight with respect to 100 parts by weight of the heat-curable resin component. When the amount of the flame retardant(s) is in this range, the flame retardancy, solder heat resistance and electrical insulation properties of the resin composition are preferably balanced at a high level.

(Other Components)

The heat-curable composition of the present invention may further contain, as required, a conventionally known coloring agent such as phthalocyanine blue, phthalocyanine green, iodine green, disazo yellow, crystal violet, titanium oxide, carbon black or naphthalene black; a conventionally known thickening agent such as asbestos, orben, benton or fine powder silica; an antifoaming agent and/or a leveling agent such as a silicone-based, fluorine-based or polymer-based ones; an adhesion-promoting agent such as a thiazole-based or triazole-based adhesion-promoting agent or a silane coupling agent; and/or a titanate-based or aluminum-based conventionally known additives.

The dry film of the present invention can be produced by coating and drying the heat-curable composition of the present invention on a carrier film and, as required, laminating a protective film thereon, to form a dry coating film.

As the material of the carrier film, polyethylene terephthalate (PET) or the like can be preferably used. The thickness of the carrier film is preferably 8 to 60 μm.

As the material of the protective film, the same material as that of the carrier film can be used, and it is preferably PET or PP. The thickness of the protective film is preferably 5 to 50 μm.

As a method of coating the heat-curable composition, for example, dip coating, flow coating, roll coating, bar coating, screen printing or curtain coating can be employed. Further, as an evaporation drying method, an apparatus equipped with a heat source utilizing a steam air-heating system, such as a hot air circulation-type drying oven, an IR (infrared) oven, a hot plate or a convection oven, can be employed.

The printed wiring board of the present invention comprises a cured article obtained by curing the heat-curable composition of the present invention or a dry coating film of the dry film. The production method thereof will be described below; however, it is not restricted to the below-described method.

The heat-curable composition of the present invention may be provided in the form of a coating material having an appropriately adjusted viscosity or in the form of a dry film obtained by coating the heat-curable composition on a support base film and subsequently drying the solvent. Alternatively, the heat-curable composition of the present invention may also be provided in the form of a prepreg sheet obtained by coating and/or impregnating a sheet-form fibrous base material, such as a glass cloth, glass or aramid nonwoven fabric, with the heat-curable composition and subsequently semi-curing the heat-curable composition. Examples of the support base film include films made of polyolefin such as polyethylene or polyvinyl chloride, polyester such as polyethylene terephthalate, polycarbonate, or polyimide; mold-release papers; and metal foils such as a copper foil and an aluminum foil. The support base film may already have been subjected to a matting treatment, a corona treatment and/or a mold-releasing treatment.

The coating material, dry film or prepreg obtained using the heat-curable composition may be directly applied on an inner-layer circuit board having a circuit formed thereon and subsequently dried and cured, or the dry film may be heat-laminated on an inner-layer circuit board, integrally molded and subsequently cured in an oven or by hot-plate pressing. In the case of the prepreg, it is superimposed on an inner-layer circuit board and the resultant is sandwiched by metal plates via mold-release films and subsequently subjected to pressing and heating.

In the above-described processes, the lamination or hot-plate pressing method is preferred because fine irregularities attributed to the inner-layer circuit are eliminated by heat-melting and the resultant is cured as it is, so that a multi-layer board with flat surface can be eventually obtained. Further, when the film or prepreg of the heat-curable composition of the present invention is laminated or hot-pressed on a base material having an inner-layer circuit formed thereon, a copper foil or a circuit-formed board may also be laminated simultaneously.

On a substrate obtained in this manner, holes are made using a semiconductor laser such as $CO_2$ laser or UV-YAG laser or a drill. The holes may be penetrating holes (through-holes) for conduction between the front and the back of the substrate, or partial holes (conformal via) for conduction between the inner-layer circuit and a circuit formed on the surface of an interlayer insulating layer.

After the formation of the holes, for the purposes of removing residues (smear) existing on the inner walls and bottoms of the holes and forming a roughened surface with fine irregularities on the substrate surface so as to allow the substrate to exhibit an effect of anchoring a conductor layer (a metal plating layer to be formed later), a treatment with a commercially available desmear solution (roughening agent) or a roughening solution containing an oxidizing agent such as permanganate, bichromate, ozone, hydrogen peroxide/sulfuric acid or nitric acid is performed at the same time.

Next, after the holes from which residues have been removed with the desmear solution and the coating film with roughened surface having fine irregularities are formed, a circuit is formed by, for example, a subtractive method or a semi-additive method. In either method, after subjecting the resultant to either or both of electroless plating and electrolytic plating, a heat treatment called "annealing" may be performed at about 80 to 180° C. for 10 to 60 minutes or so for the purposes of removing stress in the metal and improving the strength.

The metal plating used here is not particularly restricted to copper, tin, solder, nickel and the like, and a plurality of metals can be used in combination. Alternatively, the metal plating used here can be replaced by metal sputtering or the like.

The heat-curable composition of the present invention can be suitably used for producing a printed wiring board. Particularly, the heat-curable composition of the present invention can be suitably used for forming an insulating layer of a printed wiring board, such as an interlayer insulating layer or a solder resist layer. A wiring board may also be formed by pasting wires using the heat-curable composition of the present invention. Furthermore, the heat-curable composition of the present invention can also be suitably used as a sealing resin for semiconductor chips.

EXAMPLES

The present invention will now be described concretely by way of examples, comparative examples and test examples thereof, however, the present invention is not restricted thereto by any means. In the followings, unless otherwise specified, all "part(s)" and "%" are by weight.

<Miscibility of Epoxy Compound, Curing Accelerator and Curing Agent>

Figure 2:
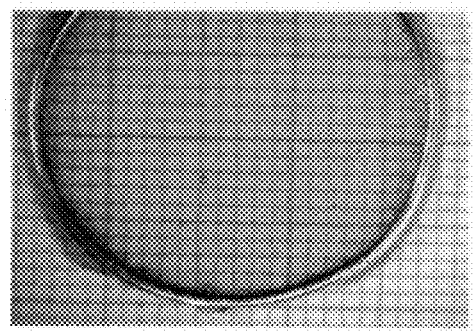
FIG. 2 shows a cured article used for evaluating the miscibility between the epoxy compounds and the curing accelerator of Example 1.
Figure 3:
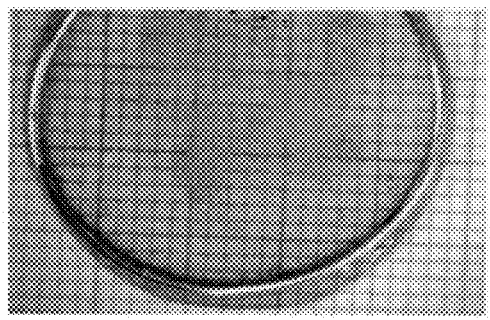
FIG. 3 shows a cured article used for evaluating the miscibility between the epoxy compounds and the curing accelerator of Comparative Example 1.

According to the formulations of Examples and Comparative Examples shown in Tables 1 and 2 below, an epoxy compound(s) (liquid epoxy resins, a solid epoxy resin(s) and/or a semisolid epoxy resin), a curing accelerator and a curing agent were mixed at the respective ratios shown in the Tables, and the resulting mixtures were each dispersed by heat-kneading at about 100° C. to obtain a heat-curable composition. Then, 0.3 ml of the thus obtained heat-curable composition was weighed and, using a gelation testing apparatus (Gelation Tester 1563, manufactured by Imoto Machinery Co., Ltd.), the heat-curable composition was cured on a hot plate having a preset temperature as shown in Tables 3 and 4 below to obtain a 1 mm-thick cured coating film, which was subsequently cooled at room temperature. Whether or not the epoxy compound(s), curing accelerator and curing agent were miscible with each other was judged based on the presence or absence of a coarse particle of 20 μm or larger by observing an area of 1 cm×1 cm under an electron microscope at a magnification of ×25. The results thereof are shown in Tables 3 and 4 below. Further, the cured articles of Example 1 and Comparative Example 1 that were used for the miscibility evaluation are shown in FIGS. 2 and 3, respectively. When the curing accelerator and the epoxy resin(s) were mixed without any curing agent at the respective ratios shown in the Tables and the miscibility was evaluated in the same manner, comparable results were obtained.

- ◯: The cured article contained no coarse particle of 20 μm or larger.
- ×: The cured article contained a coarse particle(s) of 20 μm or larger.

Examples 1 to 8 and Comparative Examples 1 and 2

According to the respective formulations shown in Tables 1 and 2 below, the components were blended and dispersed by kneading, and the resultants were each adjusted to have a viscosity of 0.5 to 20 dPa·s (rotational viscometer, 5 rpm, 25° C.), thereby obtaining the heat-curable compositions of Examples 1 to 8 and Comparative Examples 1 and 2.

TABLE 1

|  |  | Example | | | | |
|---|---|---|---|---|---|---|
|  |  | 1 | 2 | 3 | 4 | 5 |
| Liquid epoxy resin | jER828*1 | — | — | — | — | — |
|  | jER807*2 | — | — | — | — | — |
| Solid epoxy resin | NC-3000L*3 | 6.2 | 6.2 | 4.4 | 4.4 | 6.0 |
|  | YX-4000*4 | 3.3 | 3.3 | 2.4 | 2.4 | 3.1 |
| Semisolid epoxy resin | HP-4032*5 | 6.7 | 6.7 | 4.8 | 4.7 | 6.4 |
| Curing agent | HF-4M*6 | 9.0 | 9.0 | — | — | — |
|  | HPC-8000*7 | — | — | 14.6 | 14.5 | — |
|  | LA3018*8 | — | — | — | — | — |
|  | EXB9460S*9 | — | — | — | — | — |
|  | PT30*10 | — | — | — | — | 10.0 |
| Thermoplastic resin | FX-293*11 | 1.7 | 1.7 | 1.3 | 1.3 | 1.7 |
|  | KS-1*12 | 1.7 | 1.7 | 1.3 | 1.3 | 1.7 |
| Rubber particle | AC-3816N*13 | 2.0 | 2.0 | 2.0 | 2.0 | 2.0 |
| Flame retardant | HCA-HQ*14 | 2.0 | 2.0 | 2.0 | 2.0 | 2.0 |
| Inorganic filler | SO-C2*15 | 67.0 | 67.0 | 67.0 | 67.0 | 67.0 |
| Curing accelerator | 2P4MHZ*16 | 0.4 | — | — | — | — |
|  | 1B2MZ*17 | — | 0.4 | — | — | — |
|  | C11Z-A*18 | — | — | 0.2 | — | — |
|  | TPP-MK*19 | — | — | — | 0.4 | — |
|  | 4APy*20 | — | — | — | — | 0.1 |
|  | 2PHZ*21 | — | — | — | — | — |
| Organic solvent | Toluene*22 | 5.0 | 5.0 | 5.0 | 5.0 | 5.0 |
|  | Cyclohexanone*23 | 30.0 | 30.0 | 30.0 | 30.0 | 30.0 |
|  | IPSOL 150*24 | 10.0 | 10.0 | 10.0 | 10.0 | 10.0 |
| Total amount (excluding solvents) (parts by weight) | | 100.0 | 100.0 | 100.0 | 100.0 | 100.0 |

TABLE 2

|  |  | Example | | | Comparative Example | |
|---|---|---|---|---|---|---|
|  |  | 6 | 7 | 8 | 1 | 2 |
| Liquid epoxy resin | jER828*1 | — | — | — | — | 7.8 |
|  | jER807*2 | — | — | — | — | 7.8 |
| Solid epoxy resin | NC-3000L*3 | — | 14.6 | 6.2 | 6.2 | — |
|  | YX-4000*4 | — | — | 3.3 | 3.3 | — |
| Semisolid epoxy resin | HP-4032*5 | 10.6 | — | 6.7 | 6.7 | — |
| Curing agent | HF-4M*6 | — | — | 9.0 | 9.0 | 9.4 |
|  | HPC-8000*7 | 15.4 | 11.8 | — | — | — |
|  | LA3018*8 | — | — | — | — | — |
|  | EXB9460S*9 | — | — | — | — | — |
|  | PT30*10 | — | — | — | — | — |
| Thermoplastic resin | FX-293*11 | 1.3 | 1.1 | 1.7 | 1.7 | 1.8 |
|  | KS-1*12 | 1.3 | 1.1 | 1.7 | 1.7 | 1.8 |
| Rubber particle | AC-3816N*13 | 2.0 | 2.0 | 2.0 | 2.0 | 2.0 |
| Flame retardant | HCA-HQ*14 | 2.0 | 2.0 | 2.0 | 2.0 | 2.0 |
| Inorganic filler | SO-C2*15 | 67.0 | 67.0 | 67.0 | 67.0 | 67.0 |
| Curing accelerator | 2P4MHZ*16 | — | — | — | — | — |
|  | 1B2MZ*17 | 0.4 | 0.4 | 0.4 | — | 0.4 |
|  | C11Z-A*18 | — | — | — | — | — |
|  | TPP-MK*19 | — | — | — | — | — |
|  | 4APy*20 | — | — | — | — | — |
|  | 2PHZ*21 | — | — | — | 0.4 | — |

TABLE 2-continued

|  |  | Example | | | Comparative Example | |
|---|---|---|---|---|---|---|
|  |  | 6 | 7 | 8 | 1 | 2 |
| Organic solvent | Toluene*[22] | 5.0 | 5.0 | 2.5 | 5.0 | 5.0 |
|  | Cyclohexanone*[23] | 30.0 | 30.0 | 15.0 | 30.0 | 30.0 |
|  | IPSOL 150*[24] | 10.0 | 10.0 | 5.0 | 10.0 | 10.0 |
| Total amount (excluding solvents) (parts by weight) | | 100.0 | 100.0 | 100.0 | 100.0 | 100.0 |

*[1]bisphenol A-type epoxy resin (manufactured by Mitsubishi Chemical Corporation; epoxy equivalent = 184 to 194 g/eq; liquid)
*[2]bisphenol F-type epoxy resin (manufactured by Mitsubishi Chemical Corporation; epoxy equivalent = 160 to 175 g/eq; liquid)
*[3]biphenyl/phenol novolac-type epoxy resin (manufactured by Nippon Kayaku Co., Ltd.; epoxy equivalent = 272 g/eq; softening point = 52° C.)
*[4]tetramethylbiphenyl-type epoxy resin (manufactured by Mitsubishi Chemical Corporation; epoxy equivalent = 180 to 192 g/eq; softening point = 105° C.)
*[5]naphthalene-type epoxy resin (manufactured by DIC Corporation; epoxy equivalent = 145 to 157 g/eq; semisolid)
*[6]phenol novolac resin (manufactured by Meiwa Plastic Industries, Ltd.; hydroxyl equivalent = 105 to 109 g/eq; softening point = 100 to 104° C.)
*[7]α-naphthol skeleton-containing phenol resin (manufactured by DIC Corporation; hydroxyl equivalent = 222 to 224 g/eq, softening point = 110 to 140° C.)
*[8]triazine-containing cresol novolac resin (manufactured by DIC Corporation; hydroxyl equivalent = 151 g/eq; nitrogen content = 18%)
*[9]active ester compound (manufactured by DIC Corporation; active ester equivalent = 223 g/eq)
*[10]phenol novolac-type polyfunctional cyanate ester (manufactured by LONZA Japan; cyanate equivalent = 124 g/eq)
*[11]fluorene + tetramethylbiphenyl skeleton-containing phenoxy resin (manufactured by Tohto Kasei Co., Ltd.; glass transition temperature = 163° C.)
*[12]polyvinyl acetoacetal (manufactured by Sekisui Chemical Co.. Ltd.; glass transition temperature = 107° C.)
*[13]core-shell rubber particle (manufactured by Aica Kogyo Co., Ltd.)
*[14]phenolic hydroxyl group-containing compound (manufactured by Sanko-sha Co., Ltd.)
*[15]spherical silica (manufactured by Admatechs Co., Ltd.; average particle size = 0.5 μm)
*[16]imidazole derivative (manufactured by Shikoku Chemicals Corporation)
*[17]imidazole derivative (manufactured by Shikoku Chemicals Corporation)
*[18]imidazole derivative (manufactured by Shikoku Chemicals Corporation)
*[19]phosphonium salt (manufactured by Hokko Sangyo Co., Ltd.)
*[20]4-aminopyridine (manufactured by Koei Chemical Co., Ltd.)
*[21]2-phenyl-4,5-dihydroxymethylimidazole (manufactured by Shikoku Chemicals Corporation, decomposition temperature = 230° C.)
*[22]toluene (boiling point: 110° C.)
*[23]cyclohexanone (boiling point: 150° C.)
*[24]IPSOL 150 (boiling point: 184 to 205° C.)

Using a bar coater, the heat-curable compositions of Examples and Comparative Examples were each coated on a carrier film (PET film; LUMIRROR 38R75 manufactured by Toray Industries, Inc.: thickness=38 μm) at a post-drying film thickness of 40 μm and subsequently dried at 90° C. for 30 minutes, and a protective film was laminated thereon to obtain a dry film. The thus obtained dry film was evaluated by the following evaluation methods. The evaluation results are shown in Tables 3 and 4.

<Measurement of Content of Residual Organic Solvents in Dry Film (%)>

After removing the carrier film and the protective film from each of the dry films of Examples and Comparative Examples, about 1.2 g of the resin layer was collected and placed in a stopper-equipped container to precisely measure the mass of the collected resin layer (W). To this container, as an internal standard substance, one drop of ethyl 3-ethoxypropionate was added using a pipette, and the mass thereof (We) was precisely measured. Then, 5 ml of acetone was further added using a transfer pipette, and the container was tightly sealed and shaken sufficiently to dissolve the collected resin layer. Thereafter, the resulting solution was filtered through a 0.5 μm-mesh filter, and the composition of the filtrate was analyzed by gas chromatography (TRACE GC ULTRA, manufactured by Thermo Fisher Scientific K.K.). From a separately prepared calibration curve, the mass of the organic solvents with respect to 1 g of the internal standard substance was determined (Ws). From the thus obtained values, the content of residual organic solvents was calculated using the following equation:

Content of residual organic solvents (% by mass)= $(We \times Ws/W) \times 100$.

The measurement conditions in the gas chromatography were as follows.

Column: capillary column DB-1MS (30 m×0.25 mm), manufactured by Agilent Technologies, Inc.

Detector: MS(ITQ900)

Carrier gas: helium

Injector temperature: 300° C.

Detector temperature: 230° C.

Column temperature conditions: initial temperature of 50° C., held for two minutes at 50° C. after sample injection, heated to 300° C. at a rate of 10° C./min, and held for 10 minutes after reaching 300° C.

<Hardness of Dry Film (Bending Test)>

In accordance with JIS K5600-5-1 (ISO1519), using a cylindrical mandrel bending tester manufactured by BYK-Gardner Gmbh, the hardness of each of the dry films of Examples and Comparative Examples was evaluated based on the minimum mandrel diameter at which cracking of each dry film and detachment from a base material began. The evaluation criteria were as follows.

○: In a ϕ range of greater than 2 mm and less than 5 mm, neither cracking of the resin layer nor detachment of the carrier film occurred. No powdering of the resin layer occurred. In addition, even at a diameter ϕ of 2 mm or less, no cracking or powdering of the resin layer occurred, and the carrier film was not detached.

Δ: In a ϕ range of greater than 2 mm and less than 5 mm, cracking and powdering of the resin layer occurred, and the carrier film was detached.

×: At a diameter ϕ of 5 mm or greater, cracking and powdering of the resin layer occurred, and the carrier film was detached.

<Glass Transition Temperature (Tg) and Coefficient of Thermal Expansion (CTE($\alpha$1))>

The resin compositions of Examples and Comparative Examples were each laminated in the form of a dry film on the glossy surface side (copper foil) of a GTS-MP foil (manufactured by Furukawa Circuit Foil Co., Ltd.) and cured in a hot air circulation-type drying oven at 180° C. (190° C. for Example 5) for 60 minutes. Then, after removing the resulting cured article from the copper foil, a sample was cut out at a measurement size (3 mm×10 mm) and measured using TMA6100 manufactured by Seiko Instruments Inc. In the TMA measurement, the sample was heated from room temperature to 250° C. at a rate of 10° C./min, and the glass transition temperature (Tg) and the coefficient of thermal expansion (CTE($\alpha$1)) in a range of Tg or lower were determined.

<Heating-Cooling Cycle (Inhibition of Cracking)>

Using a batch-type vacuum-pressure laminator MVLP-500 (manufactured by Meiki Co., Ltd.), the dry films of Examples and Comparative Examples (resin thickness: 40 µm) were each laminated on copper of a copper-clad laminated plate under the following conditions: 5 kgf/cm$^2$, 120° C., 1 minute and 1 Torr. Then, after removing the carrier film, the resultant was heated in a hot air circulation-type drying oven at 180° C. for 30 minutes to cure the resin layer. Subsequently, using a CO$_2$ laser processing machine (manufactured by Hitachi Via Mechanics, Ltd.), via holes were formed at a top diameter of 65 µm and a bottom diameter of 50 µm.

Next, a treatment with a commercially available wet permanganate desmear solution (manufactured by ATOTECH Gmbh), electroless copper plating (THRU-CUP PEA, manufactured by C. Uemura & Co., Ltd.) and electrolytic copper plating were sequentially performed, thereby subjecting the resin layer to copper plating at a copper thickness of 25 µm such that the via holes were filled. Thereafter, the resultant was cured in a hot air circulation-type drying oven at 190° C. for 60 minutes, thereby obtaining a completely cured and copper-plated test substrate.

The thus obtained test substrate was subjected to thermal history where a single cycle consists of −65° C. for 30 minutes and 150° C. for 30 minutes. After 2,000 cycles, in order to observe the state of the bottoms and wall surfaces of the via holes under a light microscope, the central part of each via hole was cut using a precision cutter and then polished, and the state of the cut section was observed.

Evaluation was performed in accordance with the following criteria. The number of observed via holes was 100.

○: No cracking was observed.
Δ: The occurrence of cracking was 1% to less than 10%.
×: The occurrence of cracking was 10% or higher.

<BHAST Resistance>

On a BT substrate having a comb-shaped electrode (line/space=20 µm/15 µm) formed thereon, a cured coating film of a resin layer was formed to prepare an evaluation substrate. This evaluation substrate was placed in a high-temperature high-humidity chamber under an atmosphere having a temperature of 130° C. and a humidity of 85% and charged with a voltage of 5.5 V to perform an in-chamber HAST test for various time periods. The in-chamber insulation resistance value of the cured coating film of the resin layer after various time periods was evaluated based on the following criteria.

⊚: After 300 hours, the insulation resistance was not less than 10$^8$Ω.
○: After 240 hours, the insulation resistance was not less than 10$^8$Ω.
×: At a lapse of 240 hours, the insulation resistance was less than 10$^8$Ω.

TABLE 3

| | Example | | | | |
|---|---|---|---|---|---|
| | 1 | 2 | 3 | 4 | 5 |
| Hot plate temperature (° C.) | 180 | 180 | 180 | 180 | 190 |
| Miscibility between curing accelerator and epoxy resin(s) | ○ | ○ | ○ | ○ | ○ |
| Content of residual organic solvents in dry film (%) | 2.7 | 2.7 | 2.7 | 2.7 | 2.7 |
| Hardness of dry film (Bending test) | ○ | ○ | ○ | ○ | ○ |
| Glass transition temperature (Tg) (° C.) | 165 | 165 | 170 | 170 | 170 |
| Coefficient of linear expansion ($\alpha$1) (ppm) | 23 | 23 | 17 | 17 | 17 |
| Heating-cooling cycle | ○ | ○ | ○ | ○ | ○ |
| BHAST resistance | ○ | ○ | ○ | ⊚ | ○ |

TABLE 4

| | Example | | | Comparative Example | |
|---|---|---|---|---|---|
| | 6 | 7 | 8 | 1 | 2 |
| Hot plate temperature (° C.) | 180 | 180 | 180 | 180 | 180 |
| Miscibility between curing accelerator and epoxy resin(s) | ○ | ○ | ○ | × | ○ |
| Content of residual organic solvents in dry film (%) | 2.7 | 2.7 | 0.5 | 2.7 | 2.7 |
| Hardness of dry film (Bending test) | ○ | Δ | Δ | × | ○ |
| Glass transition temperature (Tg) (° C.) | 155 | 175 | 165 | 165 | 130 |
| Coefficient of linear expansion ($\alpha$1) (ppm) | 30 | 15 | 23 | 23 | 45 |
| Heating-cooling cycle | Δ | ○ | Δ | × | × |
| BHAST resistance | ○ | ○ | ○ | × | × |

From the results shown in Tables 3 and 4 above, it is seen that, in cured articles of the heat-curable compositions of Examples 1 to 8, the glass transition temperature (Tg) was high, the coefficient of linear thermal expansion (CTE) was low and the epoxy resins were miscible with the curing accelerator; and that, therefore, these heat-curable compositions are excellent in inhibiting crack generation during heating-cooling cycles. In addition, the heat-curable composition of Example 4 showed particularly excellent BHAST resistance.

On the other hand, it is seen that although the heat-curable composition of Comparative Example 1, in which the epoxy resins and the curing accelerator were not miscible, yielded a cured article having a high glass transition temperature (Tg) and a low coefficient of linear thermal expansion (CTE), crack generation during the heating-cooling cycles could not be sufficiently inhibited. In addition, it is seen that, in the cured article of Comparative Example 2 in which liquid epoxy resins, not a solid epoxy resin or semisolid epoxy resin, were incorporated, although the curing accelerator was miscible with the epoxy resins, not only the glass transition temperature (Tg) was low and the coefficient of linear thermal expansion (CTE) was high, but also crack generation during the heating-cooling cycles could not be sufficiently inhibited. Furthermore, the cured article of Comparative Example 2 had poor BHAST resistance.

DESCRIPTION OF SYMBOLS

10a: Test tube for liquid assessment
10b: Test tube for temperature measurement

11: Marked line (A line)
12: Marked line (B line)
13a, 13b: Rubber stopper
14: Thermometer

The invention claimed is:

1. A dry film, comprising:
a resin layer formed from a heat-curable composition, wherein the heat-curable composition includes
   an epoxy compound which is semisolid or solid,
   a solvent, and
   a curing accelerator that is made miscible with the epoxy compound when heated at a temperature in a range of from 130 to 220° C. and
the resin layer includes the solvent in an amount of 0.1 to 4% by weight based on a total weight of the resin layer including the solvent.

2. The dry film according to claim 1, wherein the solvent includes toluene and cyclohexanone.

3. The dry film according to claim 1, wherein the curing accelerator is at least one of an imidazole compound and a phosphonium salt.

4. A method for producing a printed wiring board, comprising:
curing the resin layer of the dry film according to claim 1.

5. The dry film according to claim 1, wherein the resin layer includes the solvent in an amount of 0.3 to 3% by weight based on the total weight of the resin layer including the solvent.

6. A printed wiring board, comprising:
a cured article obtained by a process comprising curing the resin layer of the dry film according to claim 1.

7. A printed wiring board, comprising:
a cured article obtained by a process comprising curing the resin layer of the dry film according to claim 2.

8. A printed wiring board, comprising:
a cured article obtained by a process comprising curing the resin layer of the dry film according to claim 3.

9. The dry film according to claim 1, wherein the epoxy compound is semisolid.

10. The dry film according to claim 1, wherein the epoxy compound is solid.

11. The dry film according to claim 1, wherein the epoxy compound comprises a semisolid epoxy compound and a solid epoxy compound, and is included in a total amount of 10 to 35% by weight based on a total amount of the heat-curable composition.

12. A printed wiring board, comprising:
a cured article obtained by a process comprising curing the resin layer of the dry film according to claim 11.

13. The dry film according to claim 1, wherein the curing accelerator that is made miscible with the epoxy compound when heated at a temperature in a range of from 150 to 200° C.

14. The dry film according to claim 2, wherein the solvent is at least one selected from the group consisting of isobutyl alcohol, toluene, methyl isobutyl ketone, n-butanol, butyl acetate, 2-methoxypropanol, isobutyl acetate, tetrachloroethylene, ethylene glycol monomethyl ether, methyl butyl ketone, isopentyl alcohol, ethylene glycol monoethyl ether, N,N-dimethylformamide, ethylene glycol monoethyl ether acetate, turpentine oil, cyclohexanone, and ethylene glycol monobutyl ether.

15. The dry film according to claim 2, wherein the solvent comprises at least one of toluene and cyclohexanone.

16. The dry film according to claim 15, wherein the curing accelerator comprises at least one of tri-n-butyl(2,5-dihydroxyphenyl)phosphonium bromide and hexadecyltributyl phosphonium chloride.

17. The dry film according to claim 15, wherein the curing accelerator comprises 2-phenyl-4,5-dihydroxymethylimidazole.

18. The dry film according to claim 16, wherein the curing accelerator is included in an amount of 0.1 to 5 parts by weight with respect to 100 parts by weight of a total amount of the epoxy compound which is semisolid or solid in the heat-curable composition.

19. The dry film according to claim 17, wherein the curing accelerator is included in an amount of 0.1 to 5 parts by weight with respect to 100 parts by weight of a total amount of the epoxy compound which is semisolid or solid in the heat-curable composition.

20. The dry film according to claim 11, wherein the curing accelerator is included in an amount of 0.01 to 5 parts by weight with respect to 100 parts by weight of a total amount of the epoxy compound which is semisolid or solid in the heat-curable composition.

* * * * *